(12) United States Patent
Jin et al.

(10) Patent No.: US 6,664,585 B2
(45) Date of Patent: Dec. 16, 2003

(54) SEMICONDUCTOR MEMORY DEVICE HAVING MULTILAYERED STORAGE NODE CONTACT PLUG AND METHOD FOR FABRICATING THE SAME

(75) Inventors: Beom-jun Jin, Seoul (KR); Byeong-yun Nam, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/012,563

(22) Filed: Dec. 12, 2001

(65) Prior Publication Data

US 2002/0093035 A1 Jul. 18, 2002

(30) Foreign Application Priority Data

Jan. 17, 2001 (KR) .......................................... 2001-2637

(51) Int. Cl.[7] .............................................. H01L 27/108
(52) U.S. Cl. ....................... 257/311; 257/288; 257/213; 257/296
(58) Field of Search ................................. 257/296, 311, 257/906–908, 213, 288, 202, 208, 306, 211, 774, 773, 734

(56) References Cited

U.S. PATENT DOCUMENTS

| | | | |
|---|---|---|---|
| 5,296,095 A | * 3/1994 | Nabeshima et al. | 156/662 |
| 5,726,499 A | * 3/1998 | Irinoda | 257/774 |
| 6,136,646 A | * 10/2000 | Linliu et al. | 438/255 |
| 6,137,130 A | * 10/2000 | Sung | 257/306 |
| 6,180,970 B1 | * 1/2001 | Hwang et al. | 257/295 |
| 6,239,461 B1 | * 5/2001 | Lee | 257/306 |
| 6,348,709 B1 | * 2/2002 | Graettinger et al. | 257/311 |
| 2002/0037644 A1 | * 3/2002 | Rha et al. | 438/656 |

FOREIGN PATENT DOCUMENTS

| | | | | |
|---|---|---|---|---|
| JP | 5-13750 | | 1/1993 | |
| JP | 407297280 A | * | 10/1995 | ......... H01L/21/768 |
| JP | 7-297280 | | 11/1995 | |
| JP | 2000-040805 A | * | 2/2000 | ........... H01L/21/70 |
| KR | 2001/0055403 | | 7/2001 | |

OTHER PUBLICATIONS

Miyashita, T., et al, "A Novel Bit–Line Process using Ploy–Si Masked Dual–Damascene (PMDD) for 0.13 micron DRAMs and Beyond", in Electron Devices Mtg, 2000, IEDM Techn. Digest, Dec. 10, 2000–Dec. 13, 2000, San Francisco, CA (USA) (INSPEC Accession No: 6880863).*

* cited by examiner

Primary Examiner—Nathan J. Flynn
Assistant Examiner—Johannes P Mondt
(74) Attorney, Agent, or Firm—Volentine Francos, PLLC

(57) ABSTRACT

A semiconductor memory device includes a bit line stack and a storage node contact hole which are aligned at bit line spacers formed at both side walls of the bit line stack and exposes a pad. The semiconductor memory device includes a multi-layered storage node contact plug in which a first storage node contact plug and a second storage node contact plug are sequentially formed. The first storage node contact plug is formed of titanium nitride and the second storage node contact plug is formed of polysilicon. An ohmic layer may be formed on the pad and under the first storage node contact plug. A barrier metal layer, which acts as a third storage node contact plug, may be formed on the second storage node contact plug.

10 Claims, 3 Drawing Sheets

SEMICONDUCTOR MEMORY DEVICE HAVING MULTILAYERED STORAGE NODE CONTACT PLUG AND METHOD FOR FABRICATING THE SAME

BACKGROUND OF THE INVENTION

1. Field of the Invention

The present invention relates to a semiconductor memory device and a method for fabricating the same, and more particularly, to a semiconductor memory device having a storage node contact plug and a method for fabricating the same.

2. Description of the Related Art

In semiconductor memory devices such as DRAM (Dynamic Random Access Memory) devices, a variety of contact holes are employed, including for example, a pad contact hole, a bit line contact hole, a storage node contact hole, a metal contact hole and a via contact hole. Among these contact holes, the storage node contact hole is very small, because it must be formed in a narrow region between the bit lines, and difficult to form, because it is created by deeply etching an interlayer dielectric layer. Moreover, to form the storage node contact hole in the narrow region between the bit lines, high level and precise alignment skills are required in the photolithography process. It is very difficult to reproducibly form a storage node contact hole since an alignment margin of 30 nm or less is required for a design rule of 0.15 $\mu$m or less.

Accordingly, a method for forming a storage node contact hole using a self-align contact etching process has been proposed. In the self-align contact etching process, after covering a bit line with a silicon nitride layer, the storage node contact hole is formed by etching an interlayer dielectric layer to be aligned at the silicon nitride layer, by taking advantage of the etching selectivity of the interlayer dielectric layer with respect to the silicon nitride layer. Next, a storage node contact plug material layer is formed in the storage node contact hole and then the storage node contact plug material layer is etched back, thereby forming a storage node contact plug. Thereafter, a storage node of a capacitor is formed on the storage node contact plug.

In highly integrated semiconductor memory devices, since the storage node is formed of a metal layer, the storage node plug material layer is also formed of a metal layer, such as a tungsten layer or a titanium nitride layer, in the self-align contact etching process.

However, when tungsten is used as the storage node contact plug material, the etching selection ratio (etching selectivity) of the storage node contact plug material layer (i.e., tungsten) with respect to the silicon nitride layer covering the bit line is poor. As a result, the storage node contact plug material layer made of tungsten is damaged, rather than being selectively etched. Such damage may cause a short circuit between the storage node contact plug and the bit line. Moreover, as the design rule decreases, the silicon nitride layer becomes thinner. Thus, if the silicon nitride layer is completely destroyed, margins for the self-align contact etching process are significantly decreased.

If the storage node contact plug material layer is formed of a titanium nitride layer, cracks may occur due to a large amount of stress at the titanium nitride layer when depositing the titanium nitride layer to have a thickness greater than a certain value. Moreover, the cracks may propagate to the interlayer dielectric layer, thereby causing serious problems.

SUMMARY OF THE INVENTION

To solve the above problems, it is a first object of the present invention to provide a semiconductor memory device which is capable of solving problems occurring when forming a storage node contact plug material layer comprising tungsten or titanium nitride.

It is a second object of the present invention to provide a method for fabricating the semiconductor memory device.

Accordingly, to achieve the first object, there is provided a semiconductor memory device. The semiconductor memory device includes a bit line stack, and a storage node contact hole aligned at bit line spacers formed at both side walls of the bit line stack and exposing a pad. In the storage node contact hole, a multi-layered storage node contact plug is formed by sequentially forming a first storage node contact plug and a second storage node contact plug.

Preferably, the first storage node contact plug is formed of a titanium nitride layer and the second storage node contact plug is formed of a polysilicon layer. An ohmic layer may be further formed on the pad and under the first storage node contact plug. A barrier metal layer, which acts as a third storage node contact plug, may be further formed on the second storage node contact plug.

According to another aspect of the present invention, a semiconductor memory device includes an interlayer dielectric layer formed to insulate a pad on a semiconductor substrate, and a bit line stack formed on the interlayer dielectric layer. The semiconductor memory device includes a pair of bit line spacers, which are formed at both side walls of the bit line stack, and has a storage node contact hole exposing the surface of the pad formed therebetween. In the storage node contact hole, a multi-layered storage node contact plug is formed, in which a first storage node contact plug and a second storage node contact plug are sequentially formed.

Preferably, the first storage node contact plug is formed of a titanium nitride layer and the second storage node contact plug is formed of a polysilicon layer. Preferably, the bit line stack consists of a bit line barrier metal layer, a bit line conductive layer, and a bit line cap layer which are sequentially deposited. Preferably, the bit line barrier metal layer is formed of a titanium nitride layer, the bit line conductive layer is formed of a tungsten layer, and the bit line cap layer is formed of a silicon nitride layer. A barrier metal layer, which acts as a third storage node contact plug, may be further formed on the second storage node contact plug.

To achieve the second object of the present invention, there is provided a method for fabricating a semiconductor memory device including forming a bit line stack on a semiconductor substrate, on which an interlayer dielectric layer for insulating a pad is formed. A pair of bit line spacers are formed at both side walls of the bit line stack. A storage node contact hole is formed to be aligned at the bit line spacers and expose the pad in the interlayer dielectric layer by using a self align contact etching method. A multi-layered storage node contact plug, which consists of a first storage node contact plug and a second node contact plug, is formed in the storage node contact hole.

Preferably, the first storage node contact plug is formed of a titanium nitride layer and the second storage node contact plug is formed of a polysilicon layer. A barrier metal layer, which acts as a third storage node contact plug, may be further formed on the second storage node contact plug.

The multi-layered storage node contact plug is formed by the following steps. A first storage node contact plug material layer is formed on the entire surface of the semiconductor substrate after the storage node contact hole is formed. A second storage node contact plug material layer is formed on the first storage node contact plug material layer to sufficiently fill the storage node contact hole. A second storage node contact plug is formed in the storage node contact hole by etching back the second storage node contact plug material layer. A barrier metal material layer is formed on the entire surface of the semiconductor substrate on which the second storage node contact plug is formed. The first storage node contact plug material layer and the barrier metal material layer on the bit line stack are then etched to complete the multi-layered storage node.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT

Figure 1:
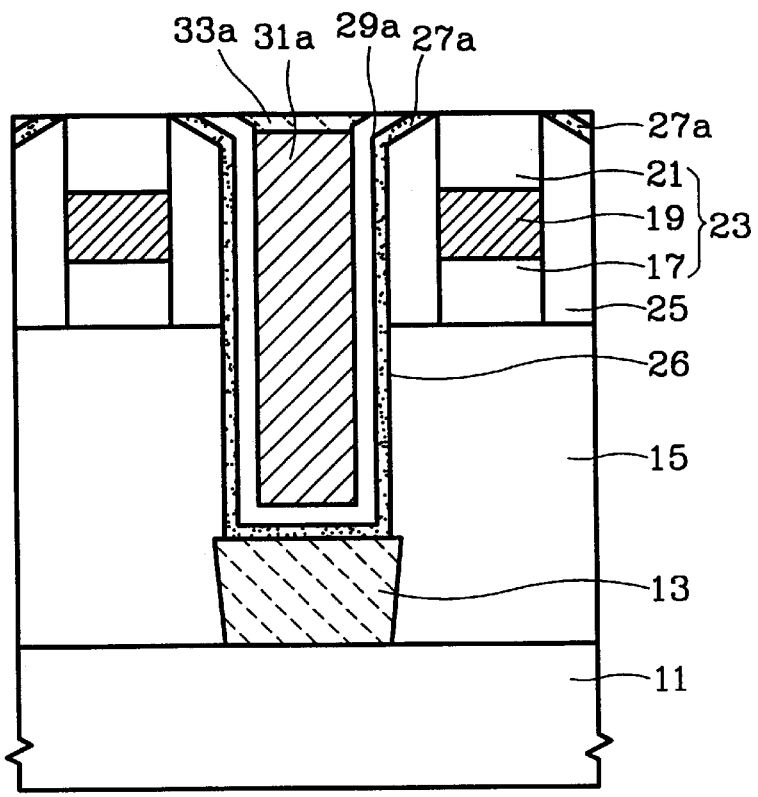
FIG. 1 is a cross-sectional view illustrating a semiconductor memory device having a multi-layered storage node contact plug according to the present invention.

The present invention will now be described more fully with reference to the accompanying drawings, in which a preferred embodiment of the invention is shown. This invention may, however, be embodied in many different forms and should not be construed as being limited to the embodiment set forth herein. Rather, this embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

FIG. 1 shows a semiconductor memory device having a multi-layered storage node contact plug according to the present invention. Specifically, a pad 13, and an interlayer dielectric layer 15 for insulating the pad 13, are formed on a semiconductor substrate 11 such as a silicon substrate. The pad 13 is formed of a polysilicon layer and the interlayer dielectric layer 15 is formed of a silicon oxide layer.

A bit line stack 23 is formed on the interlayer dielectric layer 15. The bit line stack includes a bit line barrier metal layer 17, a bit line conductive layer 19, and a bit line cap layer 21. The bit line barrier metal layer 17, the bit line conductive layer 19 and the bit line cap layer 21 are formed of a titanium nitride layer, a tungsten layer and a silicon nitride layer, respectively.

A pair of bit line spacers 25 are formed at both side walls of the bit line stack 23. The bit line spacers 25 are formed of a silicon nitride layer. A storage node contact hole 26 is formed within the interlayer dielectric layer 15 so as to be aligned between the bit line spacers 25 and expose the pad.

An ohmic layer 27a is formed in the storage node contact hole 26. The ohmic layer 27a is formed of titanium (Ti), cobalt (Co), molybdenum (Mo) or tungsten (W). A multi-layered storage node contact plug, consisting of a first storage node contact plug 29a and a second storage node contact plug 31a, is formed on the ohmic layer 27a within the storage node contact hole 26. The second storage node contact plug 31a is formed to be thicker than the first storage node contact plug 29a. The first storage node contact plug 29a is formed of a titanium nitride layer and the second storage node contact plug 31a is formed of an impurity-doped polysilicon layer.

The first storage node contact plug 29a formed of titanium nitride acts as a barrier metal layer. The second storage node contact plug 31a formed of polysilicon can be etched more easily than a conventional storage node contact plug formed of tungsten. In addition, the second storage node contact plug 31 has a superior etching selection rate, or etching selectivity, with respect to a silicon nitride layer or a titanium nitride layer. A barrier metal layer 33a for forming a storage node of a capacitor is formed on the second storage node contact plug 29a. The barrier metal layer 33a is formed of a titanium nitride layer (TiN) or a tantalum nitride layer (TaN). The barrier metal layer 33a used in the present embodiment can be used as a third storage node contact plug.

FIGS. 2 through 6 are cross-sectional views illustrating a method for fabricating a semiconductor memory device having a multi-layered storage node contact plug according to the present invention.

Figure 2:
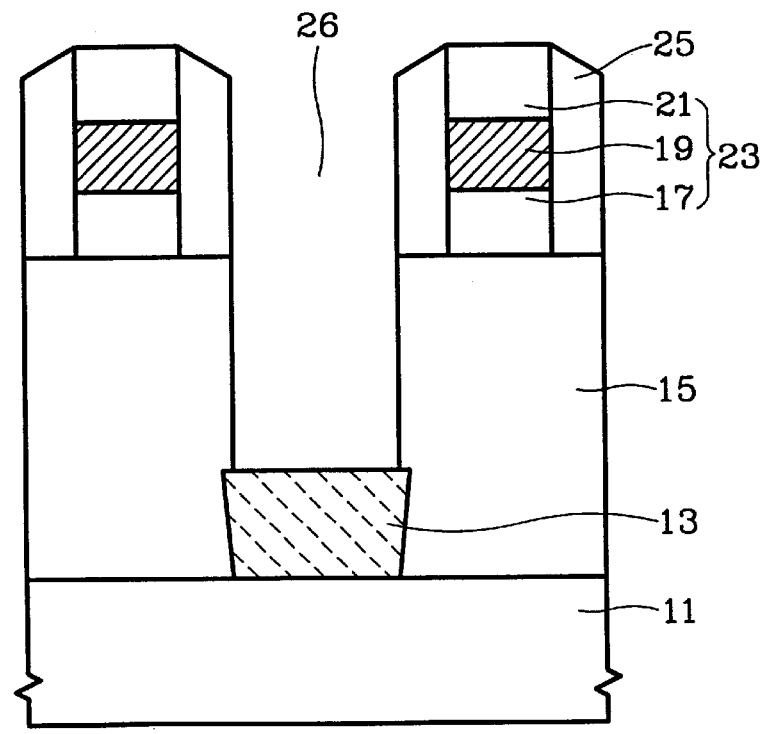
FIGS. 2 through 6 are cross-sectional views illustrating a method for fabricating a semiconductor memory device having a multi-layered storage node contact plug as in FIG. 1.

Referring to FIG. 2, a bit line stack 23 is formed on a semiconductor substrate 11, such as a silicon substrate, on which a pad 13 and an interlayer dielectric layer 15 for insulating the pad 13 have been formed. The pad 13 is formed of a polysilicon layer and the interlayer dielectric layer 15 is formed of a silicon oxide layer. The bit line stack 23 is formed by sequentially depositing a bit line barrier metal layer 17, a bit line conductive layer 19, and a bit line cap layer 21. The bit line barrier metal layer 17, the bit line conductive layer 19, and the bit line cap layer 21 are formed of a titanium nitride layer, a tungsten layer and a silicon nitride layer, respectively.

Next, a pair of spacers 25 are formed at both side walls of the bit line stack 23. The bit line spacers 25 are formed of a silicon nitride layer. Then, a storage node contact hole 26 is formed in the interlayer dielectric layer 15 so as to be aligned at the bit line spacers 25 and expose the pad. Here, a self-align contact etching method is needed because the storage node contact hole 26 is formed to be self-aligned at the bit line spacers 25 by etching the interlayer dielectric layer 15.

Figure 3:
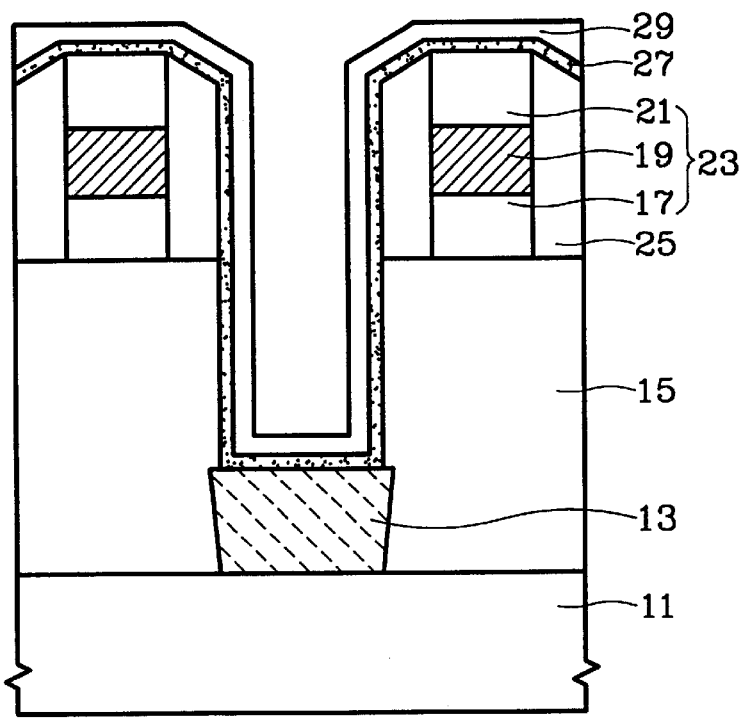

Referring to FIG. 3, an ohmic material layer 27 is formed on the entire surface of the semiconductor substrate 11 where the storage node contact hole 26 is formed. The ohmic material layer 27 is formed of titanium (Ti), cobalt (Co), molybdenum (Mo) or tungsten (W) so as to have a thickness between about 30 Å to about 100 Å. A first storage node contact plug material layer 29 is formed on the ohmic material layer 27. The first storage node contact plug material layer 29 is formed of a titanium nitride layer so as to have a thickness between about 200 Å to about 700 Å. The first storage node contact plug material layer 29 acts as a barrier metal layer. Note that the ohmic material layer 27 and first storage node contact plug material layer 29 are formed on the sidewalls of, and partially fill, the storage node contact plug 26.

Figure 4:
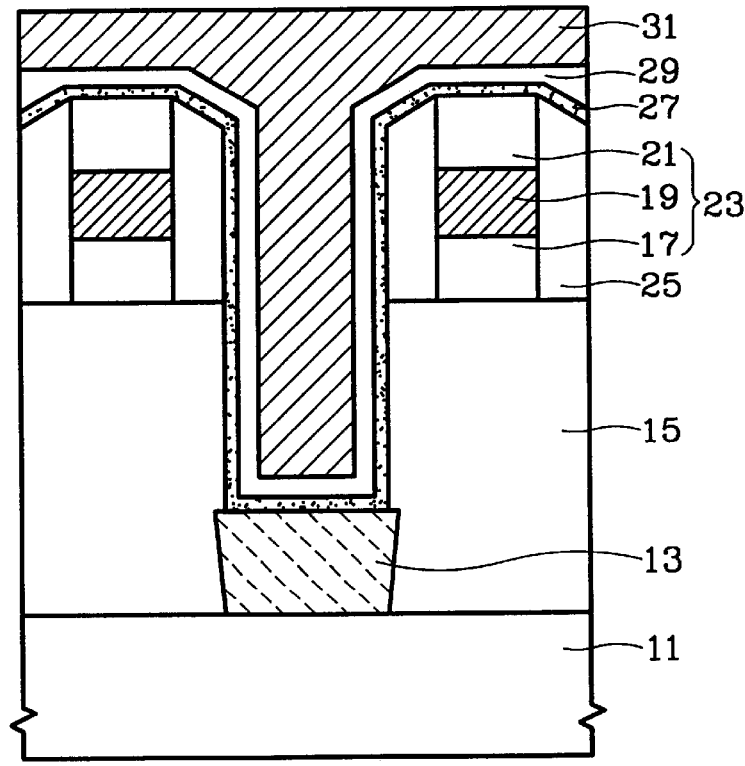

Referring to FIG. 4, a second storage node contact plug material layer 31 is formed on the entire surface of the semiconductor substrate 11 on which the first storage node contact plug material layer 29 is formed, so as to completely fill the storage node contact hole 26. The second storage node contact plug material layer 31 is formed to be thicker than the first storage node contact plug material layer 29. The second storage node contact plug material layer 31 is formed of an impurity-doped polysilicon layer, which can fill the storage node contact hole 26 more completely and can be etched more easily than the tungsten layer used in the prior art.

Figure 5:
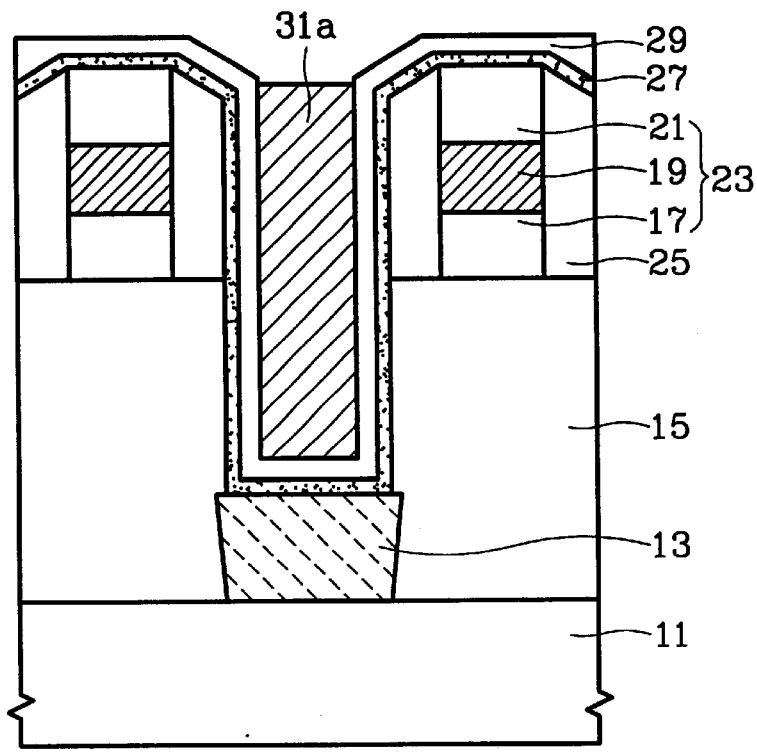

Referring to FIG. 5, the second storage node contact plug material layer 31 is etched back by a conventional etching method, thereby forming a second storage node contact plug 31a within the storage node contact hole 26. The second storage node contact plug 31a can be formed easily by taking advantage of a superior etching selectivity between the second storage node contact plug material layer 31 (formed of polysilicon) and the first storage node contact plug 29 (formed of a titanium nitride). In other words, the polysilicon layer forming the second storage node contact plug material layer 31 has a high etching rate with respect to the titanium nitride layer forming the first storage node contact plug 29 and thus, only the polysilicon layer is etched.

Figure 6:
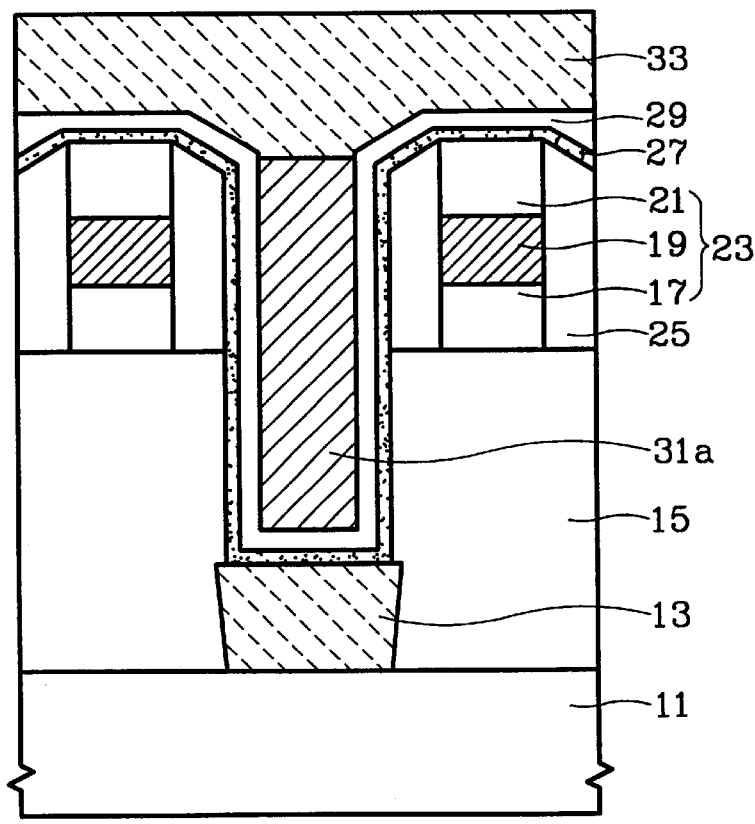

Referring to FIG. 6, a barrier metal material layer 33 is formed on the entire surface of the semiconductor substrate 11 on which the second storage node contact plug 31a is formed. The barrier metal material layer 33 is formed of a titanium nitride layer or a tantalum nitride layer to have a thickness between about 700 Å to about 1000 Å. The barrier metal material layer 33 is thinly deposited to have such a thickness, thereby preventing cracks and making it easy to etch the barrier metal material layer.

Next, as described in FIG. 1, the ohmic material layer 27, the first storage node contact plug material layer 29, and the barrier metal material layer 33 are etched back to the height of the bit line cap layer 21, thereby creating ohmic layer 27a, first storage node contact plug 29a, and barrier metal layer 33a.

As a result, the ohmic layer 27a is formed in the storage node contact hole 26, and a multi-layered storage node contact plug, comprising the first storage node contact plug 29a and the second storage node contact plug 31a, is formed on the ohmic layer 27a. The barrier metal layer 33a is formed on the second storage node contact plug 31a. The barrier metal layer 33a used in the present invention can be used as a third storage node contact plug. If the first storage node contact plug material layer 31 is etched more deeply, the barrier metal layer 33a becomes the third storage node contact plug.

As described above, according to the present invention, the storage node contact plug buried in a storage node contact hole consists of a titanium nitride layer and a polysilicon layer, by which margins for a process can be improved by taking advantage of a high etching selection ratio of the titanium nitride layer or the polysilicon layer with respect to a tungsten layer used in the prior art. Moreover, the occurrence of cracks can be prevented in a process for forming the storage node contact plug of a titanium nitride layer.

While this invention has been particularly shown and described with reference to preferred embodiments thereof, it will be understood by those skilled in the art that various changes in form and details may be made to the described embodiments without departing from the spirit and scope of the invention as defined by the appended claims.

What is claimed is:

1. A semiconductor memory device, comprising:
   a semiconductor substrate, and a pad disposed on said semiconductor substrate;
   an interlayer dielectric layer disposed on said semiconductor substrate so as to insulate the pad;
   a bit line stack forming a series of bit lines disposed on the interlayer dielectric layer;
   a pair of bit line spacers extending, respectively, along side walls of each of the bit lines of the bit line stack;
   a storage node contact hole extending between the bit line spacers of an adjacent pair of the bit lines of said bit line stack and through the interlayer dielectric layer to the pad, wherein the storage node contact hole is self-aligned with the bit line spacers of said adjacent pair of the bit lines; and
   a multi-layered storage node contact plug occupying the entirety of said storage node contact hole, said multi-layered storage node contact plug including first storage node contact plug layer of titanium nitride conformal to the storage node contact hole and a second storage node contact plug of polysilicon disposed on the first storage node contact plug layer and filling the storage node contact hole within said first storage node contact plug layer.

2. The semiconductor memory device of claim 1, wherein the bit line stack comprises a bit line barrier metal layer, a bit line conductive layer, and a bit line cap layer disposed one atop the other in the foregoing sequence.

3. The semiconductor memory device of claim 2, wherein the bit line barrier metal layer is a titanium nitride layer, the bit line conductive layer is a tungsten layer, and the bit line cap layer is a silicon nitride layer.

4. The semiconductor memory device of claim 1, further comprising a barrier metal layer formed on the second storage node contact plug.

5. The semiconductor memory device of claim 1, and further comprising an ohmic layer extending along the pad under the first storage node contact plug layer.

6. The semiconductor memory device of claim 5, wherein the ohmic layer is of a material selected from the group consisting of titanium (Ti), cobalt (Co), molybdenum (Mo) and tungsten (W).

7. The semiconductor memory device of claim 1, and further comprising a barrier metal layer disposed on the second storage node contact plug within the storage node contact hole and contacting said first storage node contact plug layer.

8. The semiconductor memory device of claim 7, wherein the barrier metal layer is one of a titanium nitride layer and a tantalum nitride layer.

9. The semiconductor memory device of claim 1, wherein the pad is of polysilicon.

10. The semiconductor memory device of claim 1, wherein the second storage node contact plug has a thickness greater than that of the first storage node contact plug layer as taken in cross section.

* * * * *